United States Patent [19]
Layton et al.

[11] Patent Number: 5,572,404
[45] Date of Patent: Nov. 5, 1996

[54] HEAT TRANSFER MODULE INCORPORATING LIQUID METAL SQUEEZED FROM A COMPLIANT BODY

[75] Inventors: Wilbur T. Layton, San Diego; Ronald A. Norell, Oceanside; James A. Roecker, Escondido, all of Calif.

[73] Assignee: Unisys Corporation, Blue Bell, Pa.

[21] Appl. No.: 531,434

[22] Filed: Sep. 21, 1995

[51] Int. Cl.$^6$ ........................................ H05K 7/20
[52] U.S. Cl. .................. 361/699; 165/80.4; 165/185; 165/907; 257/714; 361/704
[58] Field of Search ................ 174/16.3; 165/80.2, 165/80.4, 133, 185, 907; 257/707, 712–714, 718–719, 724, 726–727; 361/698–699, 704, 707–708, 715, 717–718, 722

[56] References Cited

U.S. PATENT DOCUMENTS

| | | | |
|---|---|---|---|
| 2,946,681 | 7/1960 | Probst et al. ......................... | 165/907 |
| 3,694,699 | 9/1972 | Snyder et al. ........................ | 361/705 |
| 4,233,645 | 11/1980 | Balderes et al. ..................... | 361/698 |
| 4,381,818 | 5/1983 | Sachar et al. ........................ | 165/133 |
| 4,823,863 | 4/1989 | Nakajima et al. .................... | 165/80.4 |
| 5,323,294 | 7/1994 | Layton et al. ........................ | 361/699 |
| 5,459,352 | 10/1995 | Layton et al. ........................ | 257/724 |

FOREIGN PATENT DOCUMENTS 0843692  10/1988  Japan ................................ 165/907

*Primary Examiner*—Gregory D. Thompson
*Attorney, Agent, or Firm*—Charles J. Fassbender; Mark T. Starr; Steven R. Petersen

[57] ABSTRACT

A heat transfer module, comprises: a heat generating unit and a heat receiving unit which are separated by a gap; a compliant body, having microscopic voids therethrough, which is compressed into the gap; and a liquid metal alloy that is absorbed in the microscopic voids in the compliant body. Further, the heat transfer module also includes a seal ring in the gap which surrounds the compliant body and which is spaced apart from the compliant body; and, the compliant body is intentionally compressed so much that a portion of the liquid metal alloy is squeezed from the compliant body into the space between the compliant body and the seal ring. Squeezing liquid metal alloy from the compliant body lowers the thermal resistance between the heat generating unit and the heat receiving unit by increasing the area through which heat is transferred and by increasing the thermal conductivity through the compliant body.

14 Claims, 6 Drawing Sheets

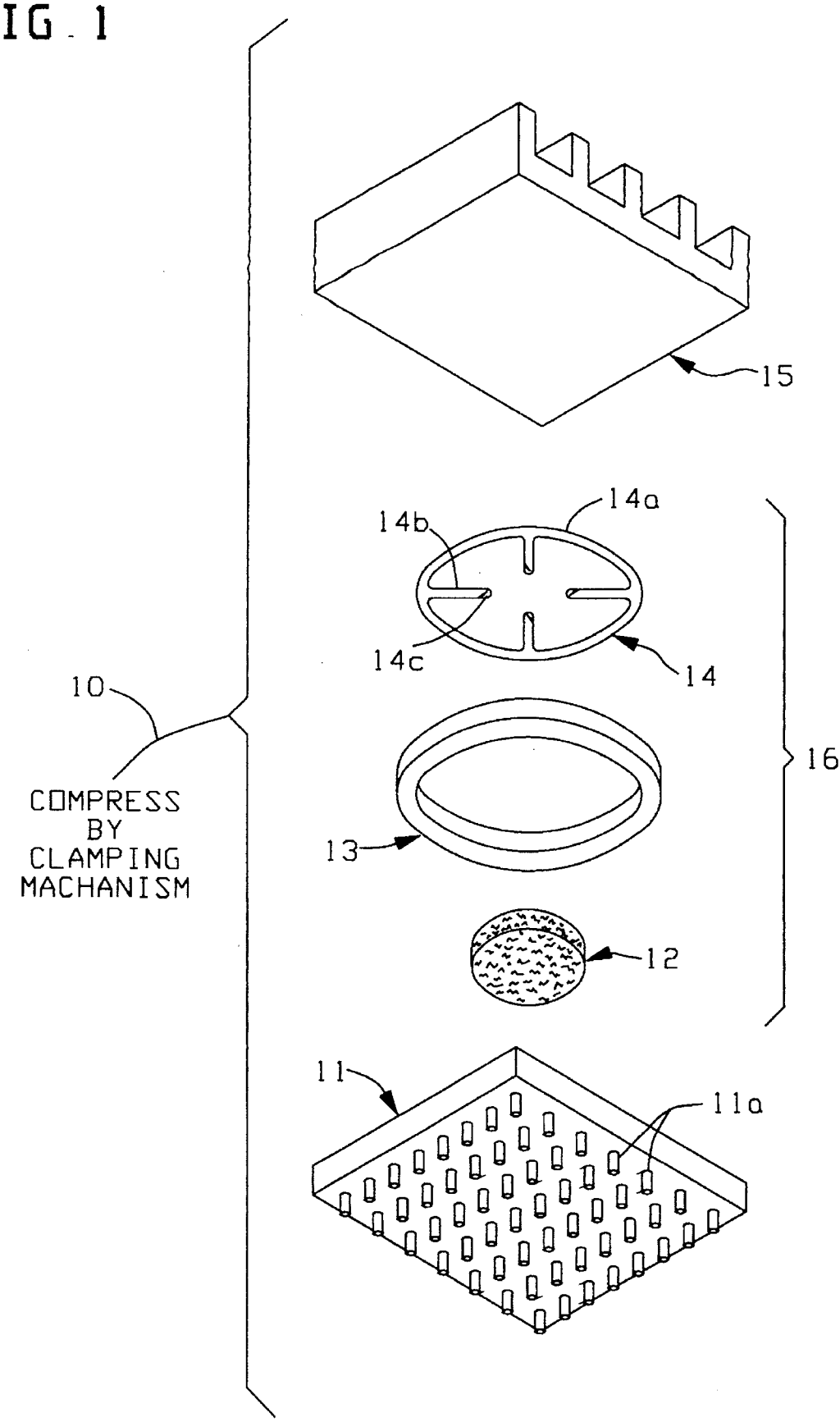

HEAT TRANSFER MODULE INCORPORATING LIQUID METAL SQUEEZED FROM A COMPLIANT BODY

BACKGROUND OF THE INVENTION

This invention relates to heat conducting mechanisms; and more particularly, it relates to structures for such mechanisms which are suitable for conducting heat away from integrated circuit packages.

By an integrated circuit package is herein meant an enclosure which—a) contains one or more integrated circuit chips, b) has input terminals for receiving power and electrical signals, and c) has output terminals on which output signals are generated. Typically, the enclosure is made of ceramic, or plastic, or metal or an epoxy glass. These integrated circuit chips dissipate heat while the chips are operating; and thus the problem arises of how to prevent the temperature of the integrated circuit package from exceeding a certain limit above which the chips will malfunction.

To address this overheating problem, many prior art mechanisms for conducting heat away from the integrated circuit packages have been disclosed. See, for example, U.S. Pat. No. 4,791,983 by Nicol, et al. entitled "Self Aligned Liquid Cooling Assembly"; and see U.S. Pat. No. 5,323,294 by Layton, et al. entitled "Liquid Metal Heat Conducting Member and Integrated Circuit Package Incorporating Same."

Each mechanism which conducts heat away from an integrated circuit package does so by providing a thermal conduction path from the integrated circuit package to a coolant, which may be air or a liquid; and this thermal conduction path inherently includes a joint between the heat conducting mechanism and the integrated circuit package. If this joint is soldered, then the task of replacing a defective integrated circuit package becomes difficult. This problem is overcome if the joint is simply pressed together; however, a joint which is pressed together has a higher thermal resistance than a joint which is soldered together and thus the operating temperature of the integrated circuit package will be increased.

Now, the above-cited U.S. Pat. No. 5,323,294 addresses the problem of how to lower the thermal resistance between two components which are pressed together, by placing between those components, a compliant body which has microscopic voids therethrough and in which a liquid metal alloy is absorbed. Examples of this structure are shown in FIGS. 2, 5, and 6 of patent '294. Due to the presence of the liquid metal alloy, the thermal resistance between the two components is substantially reduced in comparison to the thermal resistance which would otherwise occur if those two components were simply pressed against each other.

However, the present inventors have discovered that certain drawbacks still exist even with the low thermal resistance which is provided in patent '294 by the structures of FIGS. 2, 5, and 6. By eliminating these drawbacks, which are described in the "Detailed Description" in conjunction with TABLE I and FIGS. 2A–2C, the thermal resistance of a pressed joint between two components is reduced to less than half the thermal resistance which is obtained by patent '294.

BRIEF SUMMARY OF THE INVENTION

A heat transfer module, comprises: a heat generating unit and a heat receiving unit which are separated by a gap; a compliant body, having microscopic voids therethrough, which is compressed into the gap; and a liquid metal alloy that is absorbed in the microscopic voids in the compliant body. Further, in accordance with the present invention, the heat transfer module also includes a seal ring, in the gap, which surrounds the compliant body and which is spaced, at least in part, from the compliant body; and, the compliant body is intentionally compressed so much that a portion of the liquid metal alloy is squeezed from the compliant body into the space between the compliant body and the seal ring. Preferably, the liquid metal alloy which is squeezed from the compliant body fills at least 10%, but less than 100%, of the space between the compliant body and the seal ring. This liquid metal alloy which is squeezed from the compliant body lowers the thermal resistance between the heat generating unit and the heat receiving unit by increasing the area through which heat is transferred. In addition, thermal resistance between the heat generating unit and heat receiving unit is decreased because when the compliant body is compressed to the point where liquid metal alloy is squeezed out, the thermal conductivity through the compliant body approximately equals the thermal conductivity of liquid metal alloy by itself.

BRIEF DESCRIPTION OF THE DRAWINGS

Several preferred embodiments of the present invention, as well as their features and methods of fabrication, are described herein in conjunction with the accompanying drawings wherein:

FIG. 1 is an exploded pictorial view of a heat transfer module which constitutes one preferred embodiment of the present invention;

DETAILED DESCRIPTION

Figure 2A:
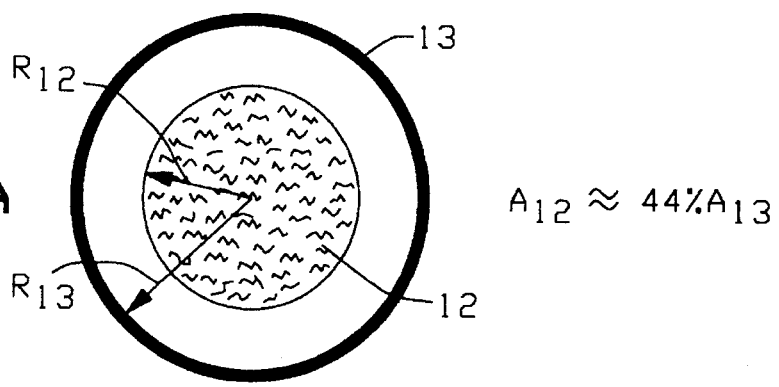
FIGS. 2A–2D are schematic diagrams which illustrate how the heat transfer module of FIG. 1 achieves a greatly reduced thermal resistance over the prior art.

Referring now to FIG. 1, a heat transfer module 10 which constitutes one preferred embodiment of the present invention will be described in detail. This Module 10 includes five components which respectively have reference numerals 11–15. Component 11 is an integrated circuit package; component 12 is a compliant body which has microscopic voids therethrough and in which a liquid metal alloy is absorbed; component 13 is a seal ring; component 14 is a retaining member; and component 15 is a heat sink.

Throughout the Figures, the compliant body 12 with its absorbed liquid metal alloy is drawn schematically as a body of entangled zig-zagged lines. These lines represent the body itself, and the spaces between the lines represent the microscopic voids which hold the liquid metal alloy. All of the details of the compliant body 12 with its absorbed liquid metal alloy are described in U.S. Pat. No. 5,323,294 which is assigned to the assignee of the present invention; and those details are incorporated herein by reference.

In FIG. 1, the components 11–15 are shown in an exploded view so that they can be seen more completely; but in the actual heat transfer module 10, the components 11–15 are squeezed together. To form this module 10, the retaining member 14 has a periphery portion 14a which is attached by an adhesive to the seal ring 13. Also, the retaining member 14 has four arms 14b which extend towards each other, and a hook 14c is provided on the end of each arm. These hooks 14c catch on the compliant body; and they hold the compliant body within, but spaced apart from, the seal ring 13.

When the compliant body 12 and the seal ring 13 and the retaining member 14 are all held together as described above, those three components form a sub-assembly 16. Within the module 10, the sub-assembly 16 is squeezed between the integrated circuit package 11 and the heat sink 15. Consequently, the integrated circuit package 11 and the heat sink 15 are separated by a gap in which the sub-assembly 16 is compressed. This compression of the sub-assembly 16 between the integrated circuit package 11 and heat sink 15 may be achieved by any clamping mechanism; examples of which are described in U.S. Pat. No. 5,307,239 and co-pending application, Ser. No. 08/519,956 by Tustaniwskyj, et al.

In operation, electrical signals and electrical power are sent a subset of the terminals 11a on to the integrated circuit package 11; and in response, the integrated circuit package 11 generates output signals on another subset of the terminals 11a and dissipates heat. This heat must be removed in order to insure that the temperature of the integrated circuit package does not go above a certain limit at which the output signals are generated improperly.

One primary feature of the present invention is that the sub-assembly 16 provides a very low thermal resistance $R_T$ between the integrated circuit package 11 and the heat sink 15. This is important because the temperature of the integrated circuit package 11 equals $T_{HS}+R_T W$, where $T_{HS}$ is the temperature of the heat sink 15 and w is the power dissipated in the integrated circuit package 11. Thus, a small $R_T$ means that for each watt which is dissipated by the integrated circuit package 11, the corresponding temperature rise across the sub-assembly 16 is small. How this low thermal resistance is achieved by the sub-assembly 16, is illustrated in FIGS. 2A–2D.

Considering first FIG. 2A, it shows the compliant body 12 and the seal ring 13 before they are compressed between the integrated circuit package 11 and the heat sink 15. In FIG. 2A, the compliant body 12 occupies an area $A_{12}$ which is about 44% of the area $A_{13}$ which is enclosed by the seal ring 13.

Figure 2B:
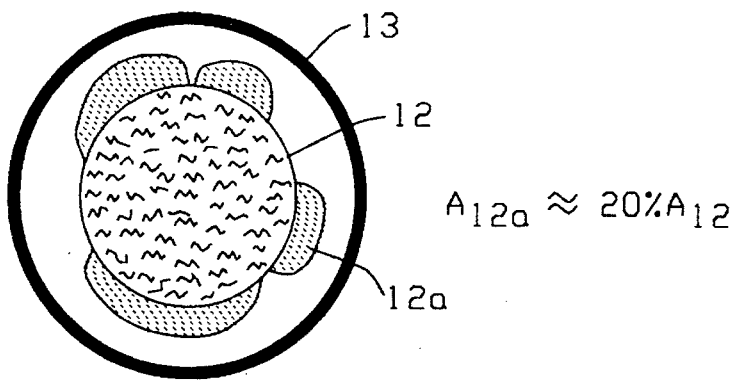

Next, in FIG. 2B, the compliant body 12 and the seal ring 13 get compressed between the integrated circuit package 11 and the heat sink 15 to such an extent that the liquid metal alloy 12a intentionally starts to get squeezed out of the compliant body 12. This liquid metal which is squeezed from the compliant body 12 is confined to the space between the compliant body and the seal ring 13. In FIG. 2B, this liquid metal 12a occupies an area $A_{12a}$ which equals about 20% of the area $A_{12}$ of the compliant body itself. Consequently, the total area $A_{12}$ plus $A_{12a}$ equals about 53% of the area $A_{13}$ which the seal ring 13 encloses.

Figure 2C:
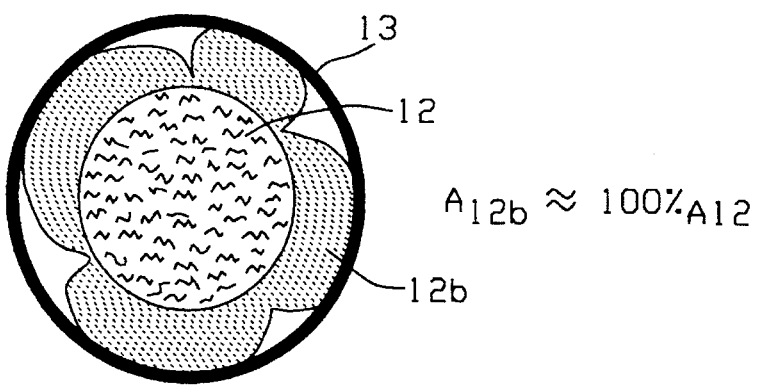

Next, as shown in FIG. 2C, the compliant body 12 and the seal ring 13 are compressed even further between the integrated circuit package 11 and the heat sink 15. Due to this compression, the amount of liquid metal which is squeezed out of the compliant body 12 is increased as indicated by reference numeral 12b. In FIG. 2C, the liquid metal 12b has an area $A_{12b}$ which is approximately equal to the area $A_{12}$ of the compliant body itself. Consequently, the total area which is occupied by the compliant body 12 and the liquid metal 12b is approximately 88% of the area $A_{13}$ which the seal ring 13 encloses.

Lastly, in FIG. 2C, the compliant body 12 and the seal ring 13 are compressed until all of the area between the compliant body 12 and the seal ring 13 is filled with liquid metal 12c. Consequently, the area $A_{12c}$ which the liquid metal 12c occupies, plus the area $A_{12}$ of the compliant body 12 equals the area $A_{13}$ which the seal ring 13 encloses.

Now, the thermal resistance between the integrated circuit package 11 and the heat sink 15 is expressed mathematically as $$R_T = \frac{1}{K}\left(\frac{d}{A}\right).$$

In this expression, "A" is the area through which heat is transmitted from the integrated circuit package 11 to the heat sink 15; "d" is the distance between the integrated circuit package and the heat sink 15; and "K" is the thermal conductivity of the material through which the heat is transmitted.

In FIG. 2A, the thermal resistance $R_T$ is relatively large because the area "A" through which heat is transmitted equals just the area $A_{12}$ of the compliant body 12. By comparison, in FIG. 2B, the thermal resistance is reduced because the area through which heat is transmitted equals the area $A_{12}$ of the compliant body 12 plus the area $A_{12a}$ of the liquid metal 12a that is squeezed from the compliant body.

Similarly, in FIG. 2C, the thermal resistance $R_T$ is further reduced because the area through which heat is transmitted equals the area $A_{12}$ of the compliant body 12 plus the area $A_{12b}$ of the liquid metal 12b that is squeezed from the compliant body. Likewise, in FIG. 2D, the thermal resistance $R_T$ is still further reduced because the area through which heat is transmitted equals the area $A_{12}$ of the compliant body 12 plus the area $A_{12c}$ of the liquid metal 12c that is squeezed from the compliant body.

Also, in FIGS. 2A through 2D, the thermal resistance $R_T$ progressively becomes smaller because in each successive figure, the thickness of the compliant body 12 and the seal ring 13 is decreased. Consequently, in the above-described equation for $R_T$, the distance "d" progressively decreases.

Further, in FIGS. 2A–2D, the thermal resistance progressively becomes smaller because the thermal conductivity "K" of the materials through which the heat is transmitted becomes larger. In FIG. 2A, the thermal conductivity "K" has a value which accounts for the fact that the compliant body 12 has microscopic voids in which liquid metal alloy is absorbed, but in which the voids are only partially filled. By comparison, in FIGS. 2B–2D, the thermal conductivity "K" gets progressively larger to account for the facts that—
1) some of the heat is being transmitted through pure liquid metal which is squeezed from the compliant body, and 2) the microscopic voids in the compliant body become more full with liquid metal as the voids are reduced in size due to compression.

A numerical example of the above-described reduction in the thermal resistance $R_T$ is provided below in TABLE 1. This TABLE 1 has four rows which are labeled 2A–2D, and the entries in those rows respectively apply to the structures of FIGS. 2A–2D. In TABLE 1, the entries A, d, K and $R_T$ are the terms which occur in the previously described equation $$R_T = \frac{1}{K} \left( \frac{d}{A} \right)$$

for thermal resistance. An outside diameter of 0.0019 meters (¾ inches) is assumed for the compliant body 12, and an inside diameter of 0.0029 meters (1⅛ inches) is assumed for the barrier 13.

structure. Thus, both the FIG. 2C structure and the FIG. 2D structure are substantial improvements over the FIG. 2A structure.

Figure 2D:
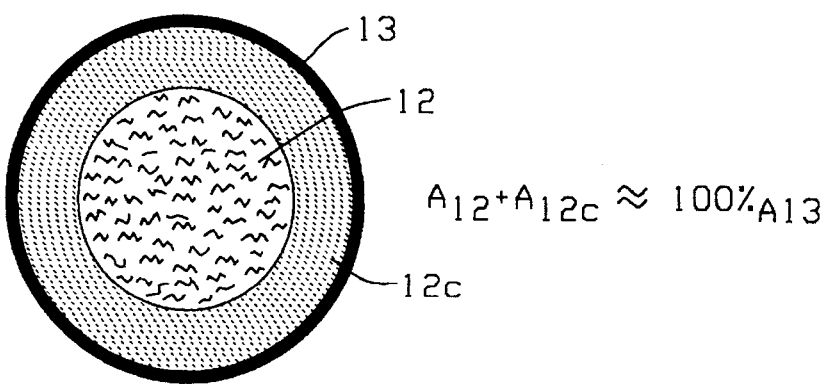

Suppose now that the thermal resistance for the structure of FIGS. 2C and 2D is compared to the thermal resistance for a modified FIG. 2A structure in which the area of the compliant body 12 increased to completely fill the area within the seal ring 13. In that case, the thermal resistance for the modified FIG. 2A structure will be:

TABLE 1

| | A (meter²) | d (meter) | K (watts/meter-°C.) | | $R_T$ (°C./watt) |
|---|---|---|---|---|---|
| 2A | $A_{12}$ = 0.00028 | 0.00025 | 10 | | 0.089 |
| 2B | $A_{12}$ + 20% $A_{12}$ = 0.00034 | 0.00021 | $\frac{55(0.00028) + 60(0.0006)}{0.00034}$ | = 55.8 | 0.011 |
| 2C | $A_{12}$ + $A_{12}$ = 0.00057 | 0.00013 | $\frac{15(0.00028) + 60(0.00028)}{0.00057}$ | = 57.5 | 0.0039 |
| 2D | $A_{13}$ = 0.00065 | 0.00011 | $\frac{55(0.00028) + 60(0.00037)}{0.00065}$ | = 57.8 | 0.0030 |

In rows 2A–2D, the area entry "A" gets progressively bigger because liquid metal alloy is being squeezed out of the compliant body 12. Also, in rows 2A–2D, the distance "d" entry gets progressively smaller because the compliant body is being compressed. Further, in rows 2A–2D, the thermal conductivity "K" entry gets progressively smaller. In TABLE 1, "K" is the area weighted average of—1) a typical thermal conductivity for pure liquid metal alloy and 2) a typical thermal conductivity for the compliant body 12 with its absorbed liquid metal alloy. Actual values used in TABLE I for the thermal conductivity will now be explained.

According to U.S. Pat. No. 5,323,294, the thermal conductivity K for a compliant body with absorbed liquid metal allow is 5–20 watts/meter° C.; whereas the thermal conductivity K of pure liquid metal alloy is 30–100 watts/meter° C. See patent '294 at column 3, lines 60–67.

But, in patent '294, the voids in the compliant body are only partially filled with the liquid metal alloy; and the degree to which the compliant body is squeezed is limited such that all of the liquid metal alloy is retained in the microscopic voids of the compliant body. As the voids in the compliant body get filled more and more with liquid metal alloy, the thermal conductivity K for the compliant body with its absorbed liquid metal alloy gets larger and larger.

When the compliant body is compressed to the point where the liquid metal alloy is being squeezed out, the thermal conductivity of the compliant body with its absorbed liquid metal alloy nearly equals the thermal conductivity of the liquid metal alloy itself. In TABLE I, the thermal conductivity for the pure liquid metal alloy is selected as 60 watts/meter° C.; and the thermal conductivity for the compliant body with liquid metal alloy being squeezed out is shown in rows 2B–2D as 55 watts/meter° C. By comparison, in row 2A, the thermal conductivity K is only 10 watts/meter° C.

Inspection of the $R_T$ entry in TABLE 1 shows that the thermal resistance for the FIG. 2A structure is about twenty-two times the thermal resistance for the FIG. 2C structure; and, the thermal resistance for the FIG. 2A structure is about twenty-nine times the thermal resistance of the FIG. 2A $$R_T = \frac{1}{K} \left( \frac{d}{A} \right) = \frac{1}{10} \left( \frac{0.00025}{0.00065} \right) = 0.0385° \text{ C./Watt}$$

But, this thermal resistance for the modified FIG. 2A structure is still more than ten times larger than the thermal resistance for the structure of FIGS. 2C and 2D, as given in rows 2C and 2D of TABLE 1.

One additional feature of the FIG. 2C structure is that the space within the seal ring 13 which remains unfilled with liquid metal alloy helps to prevent leaks if the module 10 is subjected to extreme shock and/or vibration. In that case, the shock/vibration can propel a portion of the liquid metal alloy out of the compliant body. Similarly, the shock/vibration may temporarily reduce the distance between the heat sink 15 and the integrated circuit package and thereby squeeze extra liquid metal alloy from the compliant body 12. Likewise, extra liquid metal alloy can be squeezed from the compliant body whenever the compliant body is compressed by a varying amount due to manufacturing tolerance. By leaving some empty space within the seal ring 13, room is provided to receive this extra liquid metal alloy.

Figure 3A:
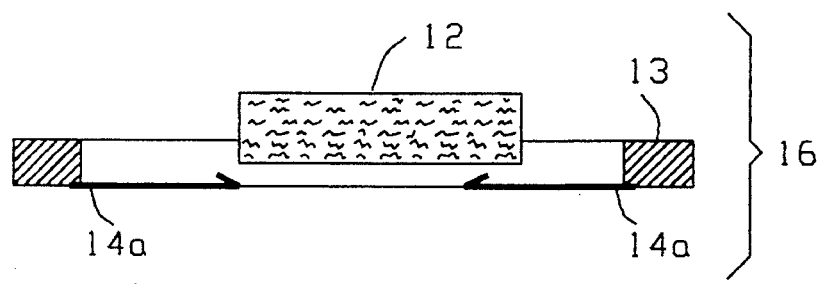
FIGS. 3A–3F are schematic diagrams that illustrate a process by which a sub-assembly within the FIG. 1 heat transfer module is connected together.
Figure 3B:
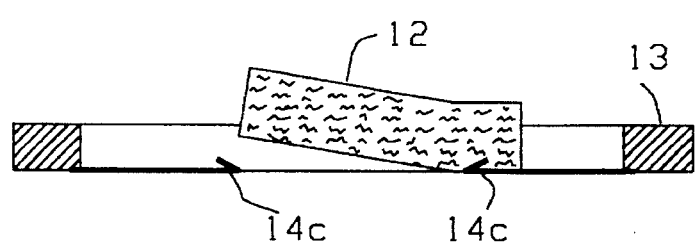
Figure 3C:
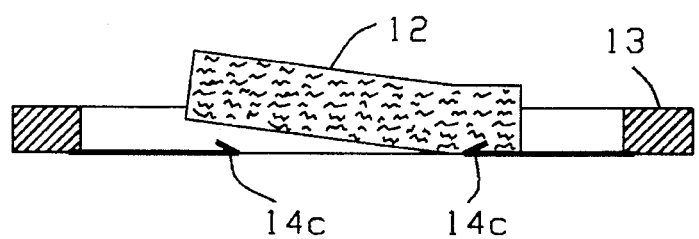
Figure 3D:
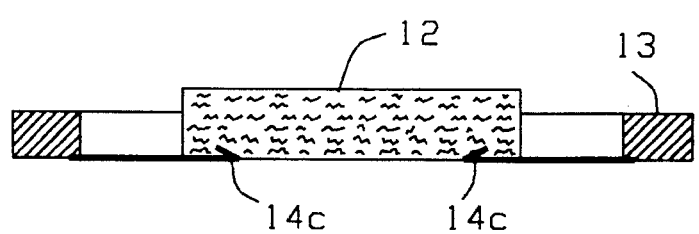

Turning now to FIGS. 3A–3F, a series of steps by which the sub-assembly 16 is fabricated will be described. Initially, as is shown in FIG. 3A, the periphery portion 14a of the retaining member 14 is attached by an adhesive to the seal ring 13. Thereafter, as is shown in FIGS. 3B, 3C, and 3D, the compliant body 12 is attached to the retaining member 14. This may be achieved by stretching the compliant body 12 across the hooks 14c which are on the arms of the retaining member 14. Since the compliant body has microscopic voids therethrough, the hooks 14c are easily caught in the compliant body. Alternatively, the compliant body 12 may be attached to the retaining member 14 by gently pressing down on the compliant body for just an instant. This causes the compliant body 12 to expand horizontally and then contract; and during the contraction, the compliant body will get caught on the hooks 14c.

Figure 3E:
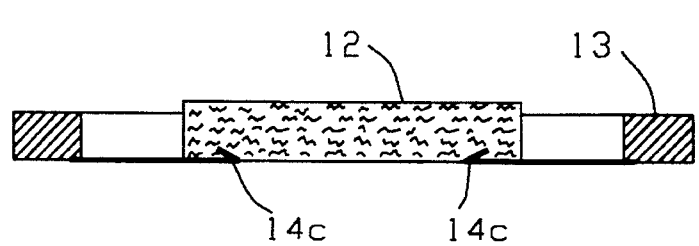
Figure 3F:
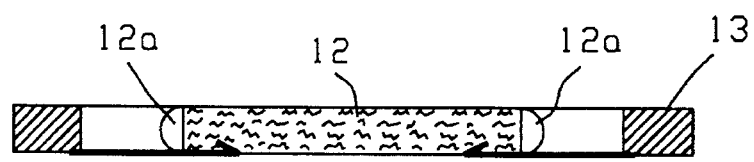

After the sub-assembly 16 is fabricated, it is ready to be compressed between the integrated circuit package 11 and the heat sink 15; and this compression is illustrated in FIGS. 3E and 3F. In FIG. 3E, the compression is so slight that it is completely accommodated by just the partially filled voids in the compliant body 12, and so no liquid metal alloy is squeezed from the compliant body. By comparison, in FIG. 3F, the compression is increased to the point where the liquid metal alloy 12a begins to get squeezed out from the compliant body.

One important feature of the sub-assembly 16 is that the compliant body 12 can be filled with the liquid metal alloy as a separate, independent fabrication step before the compliant body is placed in the sub-assembly 16. This feature is achieved because the hooks 14c readily catch onto the compliant body 12 even when its microscopic pores are filled with the liquid metal alloy.

Another important feature of the sub-assembly 16 is that the compliant body 12 is held in the sub-assembly in an easily removable fashion. To remove the compliant body 12, the steps of FIGS. 3B, 3C, and 3D simply are performed in reverse order. Removal of the compliant body 12 and replacement with a new one is desirable whenever the corresponding integrated circuit package 11 which is being cooled becomes defective and needs to be replaced. This insures that the amount of liquid metal alloy which is held in the sub-assembly 16 remains constant, and thus the thermal resistance $R_T$ between the integrated circuit package 11 and the heat sink 15 also remains constant.

Also, the above removal feature enables the module 10 to be incorporated into test equipment for integrated circuit packages such that all of the components 12–15 comprise a part of the tester. In that case, the integrated circuit package 11 which is being tested will be changed repeatedly, and a small amount of liquid metal alloy may be lost as each integrated circuit package is removed. But that problem is overcome by simply replacing the compliant body 12 when each integrated circuit package is removed.

Figure 4:
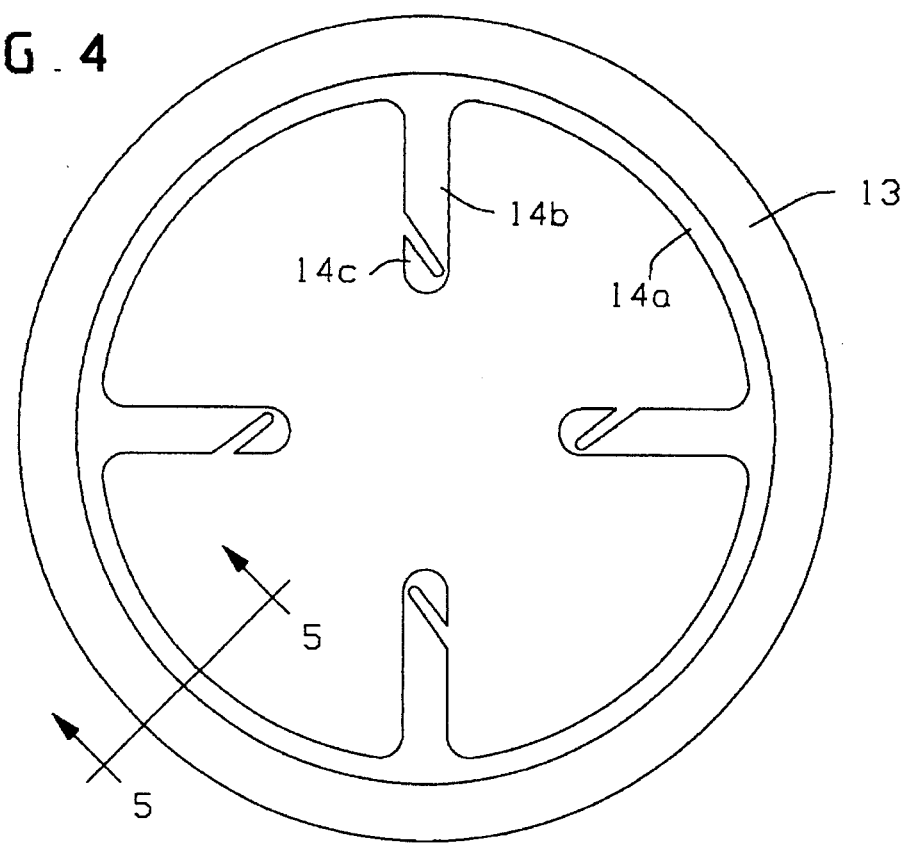
FIG. 4 is a plan view of two components in the sub-assembly of FIGS. 3A–3F.
Figure 5:
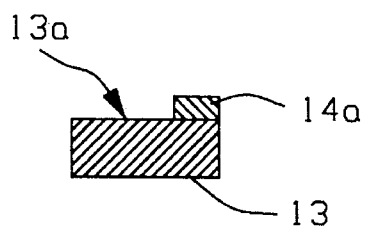
FIG. 5 is a sectional view taken along lines 5—5 in FIG. 4.
Figure 6:
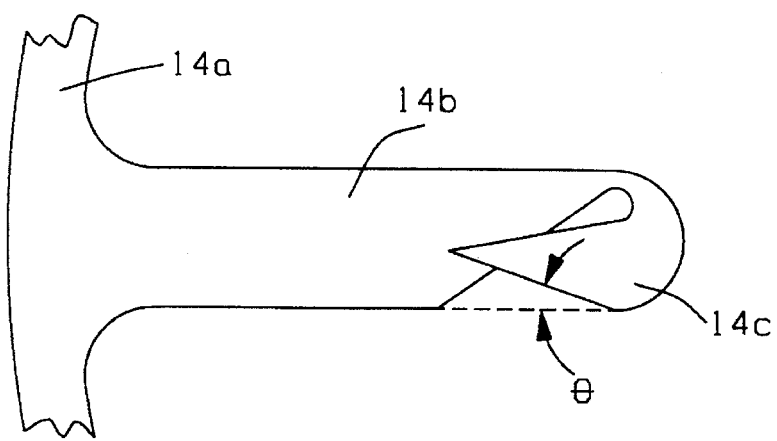
FIG. 6 is an enlarged view of a portion one of the FIG. 4 components.

Turning now to FIGS. 4, 5 and 6, additional details of the retaining member 14 can be seen. In those figures, the periphery portion 14a of the retaining member has an inside radius which coincides with the inside radius of the seal ring 13. By comparison, the periphery portion 14a of the retaining member has an outside radius which is less than the outside radius of the seal ring 13. Consequently, if the upward facing surface of the seal ring 13 in FIG. 5 is coated with an adhesive 13a, one portion of that surface is easily attached to the retaining member and the remainder is easily attached to the heat sink or integrated circuit package.

Preferably, the retaining member 14 is made of a thin, flat sheet of metal, such as a 2.0 mil thick sheet of stainless steel. From that sheet, the retaining member having the shape shown in FIG. 4 can be punched-out, cut-out, or chemically etched out. Thereafter, the hooks 14c on each of the arms 14b are bent outward at an angle θ of 10° to 30°, as shown in FIG. 6, so that the hooks easily catch in the microscopic voids of the compliant body 12.

As an alternative, the number of arms on the retaining member 14 can be increased or decreased. Preferably, for ease of manufacturing, the total number of arms is from two to ten.

One preferred embodiment of the invention has now been described in detail. In addition, however, many changes and modifications can be made to the details of this one embodiment without departing from the nature and spirit of the invention; and, such modification will now be described in conjunction with FIGS. 7–14.

Figure 7:
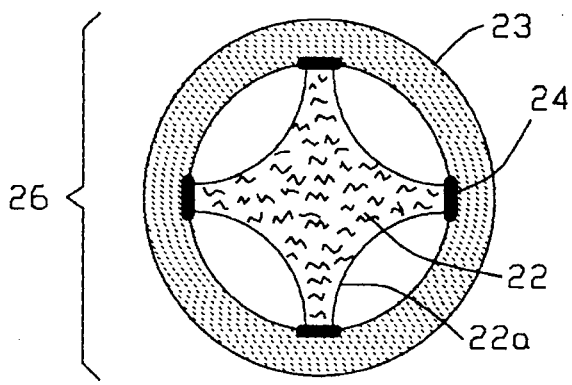
FIGS. 7–12 each illustrate an alternative embodiment to the sub-assembly of FIGS. 3A–3F; and, FIGS. 13–14 each illustrate an alternative embodiment to the component of FIG. 6.

In FIG. 7, a sub-assembly 26 is shown which is a modification of the previously described sub-assembly 16 of FIG. 1. This sub-assembly 26 includes a compliant body 22 which has microscopic voids therethrough and in which a liquid metal alloy is absorbed just like the complaint body 12 of FIG. 1. In addition, the sub-assembly 26 includes a seal ring 23 which surrounds the compliant body 22. No separate retaining member, such as the previously described member 14, is included in the sub-assembly 26. Instead, the compliant body 22 has arms 22a which extend outward and contact the interior of the seal ring 23; and those arms are attached to the seal ring by an adhesive 24. When this sub-assembly 26 is compressed between an integrated circuit package and a heat sink, liquid metal alloy is squeezed from a compliant body 22 into the spaces which are provided between the compliant body and the seal ring 23.

Figure 8:
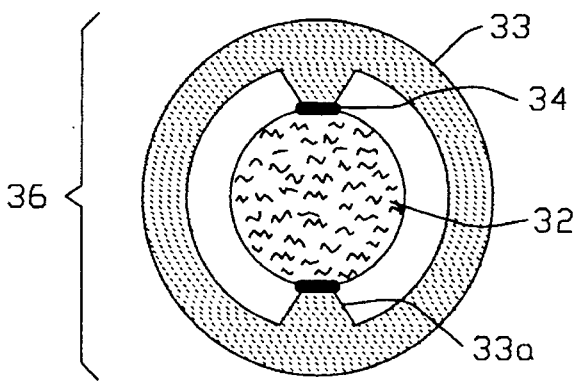

Similarly in FIG. 8, a sub-assembly 36 is shown which is another modification of the previously described sub-assembly 16 of FIG. 1. This sub-assembly 36 includes a compliant body 32 which has microscopic voids therethrough and in which a liquid metal alloy is absorbed just like the compliant body 12 of FIG. 1. In addition, the sub-assembly 26 includes a seal ring 33 which surrounds the compliant body 32. Again, no separate retaining member is included in the sub-assembly 36. Instead, the seal ring 33 has arms 33a which extend outward and contact the exterior of the compliant body 32; and those arms are attached to the compliant body by an adhesive 34. When this sub-assembly 36 is compressed between an integrated circuit package and a heat sink, liquid metal alloy is squeezed from a compliant body 32 into the spaces which are provided between the compliant body and the seal ring 33.

Figure 9:
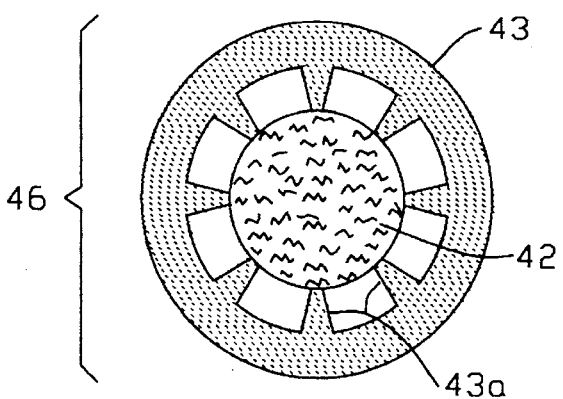

Likewise, in FIG. 9, a sub-assembly 46 is shown which is still another modification of the previously described sub-assembly 16 of FIG. 1. This sub-assembly 46 includes a compliant body 42 which has microscopic voids therethrough and in which a liquid metal alloy is absorbed just like the compliant body 12 of FIG. 1; and in addition, the sub-assembly 46 includes a seal ring 43 which surrounds the compliant body 42. Also in this sub-assembly 46, the seal ring 43 has multiple arms 43a which extend outward and push against the exterior of the compliant body 42; and those arms hold the compliant body 42 in place by friction.

Figure 10:
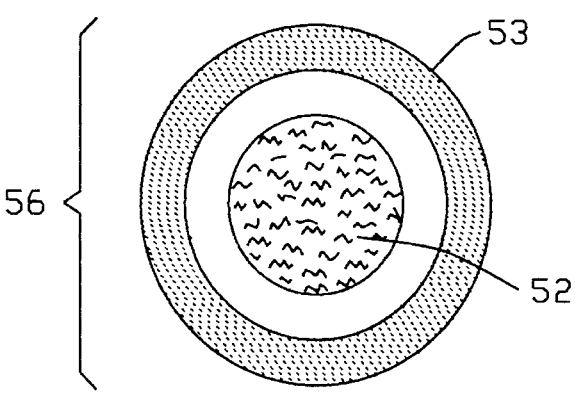

In FIG. 10, two separate components 52 and 53 are shown which respectively correspond to the compliant body 12 and the seal ring 13 of FIG. 1. Those two components can be attached by an adhesive to the heat sink 15 and/or to the integrated circuit package 11; and thus the retainer 14 can be eliminated. Alternatively, the components 52 and 53 can simply be placed on the heat sink 15 and/or the integrated circuit package 11 without any adhesive provided that the surface on which the components 52 and 53 are placed is horizontal. Then, after the heat sink and integrated circuit package are squeezed together, the components 52 and 53 are held in place by friction.

Figure 11:
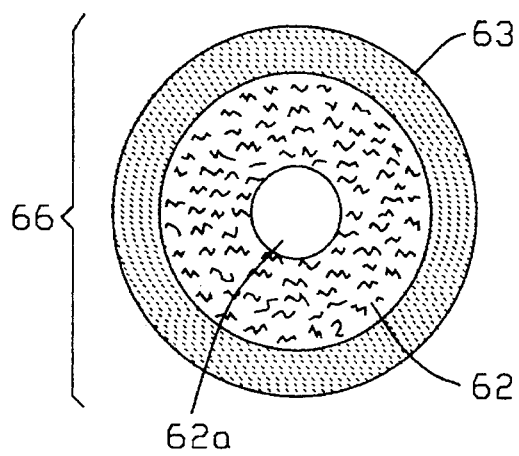

In FIG. 11, a sub-assembly 66 is shown which includes a compliant body 62 which has microscopic voids therethrough and in which a liquid metal alloy is absorbed just like the compliant body 12 of FIG. 1. In addition, the sub-assembly 66 includes a seal ring 63 which surrounds and presses against the entire perimeter of the compliant body 62; and thus the compliant body is held in place by friction. Also, the compliant body 62 has a central opening 62a. When this sub-assembly 66 is compressed between an integrated circuit package and a heat sink, liquid metal alloy is squeezed from a compliant body 62 into the opening 62a.

Figure 12:
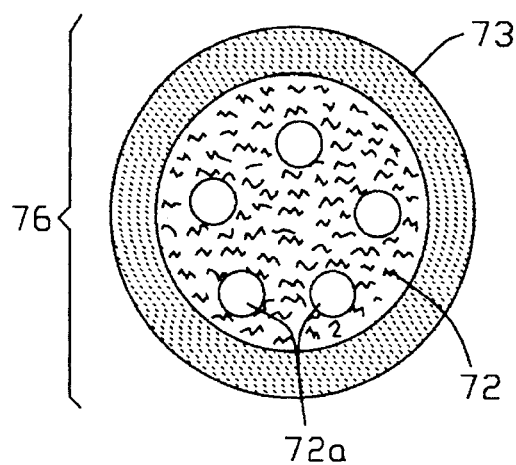

Similarly in FIG. 12, a sub-assembly 76 is shown which includes a compliant body 72 which has microscopic voids therethrough and in which a liquid metal alloy is absorbed just like the compliant body 12 of FIG. 1. In addition, the sub-assembly 76 includes a seal ring 73 which surrounds and presses against the entire perimeter of the compliant body 72 such that the compliant body is held in place by friction. Also, the compliant body 72 has several internal openings 72a which in FIG. 12 are shown as five openings, but which can be any desired number. When this subassembly 76 is compressed between an integrated circuit package and a heat sink, liquid metal alloy is squeezed from a complaint body 72 into the openings 72a.

Figure 13:
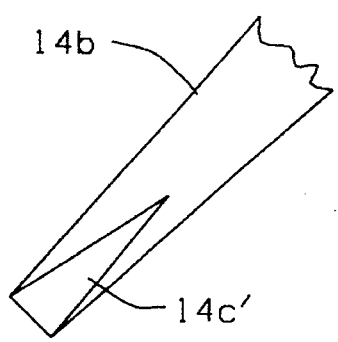
Figure 14:
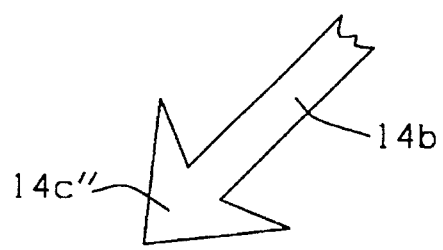

Next, in FIGS. 13 and 14, two modifications to the previously described retaining member 14 are illustrated. In FIG. 13, each arm 14b of the retaining member is modified such that it has a differently shaped hook 14c'. This hook 14c' is formed by shaping the end of the arm 14b into a point; and thereafter, bending the point backwards towards the periphery portion of the retaining member. In FIG. 14, each arm 14b of the retaining member also has a differently shaped hook 14c". This hook 14c" has two barbs which extend from opposite sides of the arm, instead of just a single barb as was previously described in conjunction with FIG. 6.

Figure 15:
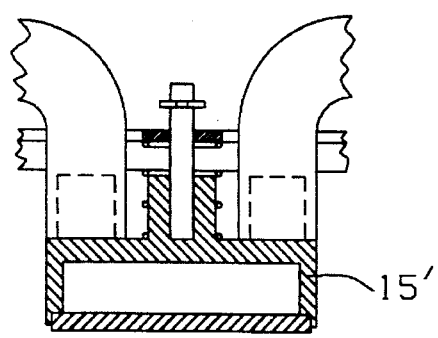
FIG. 15 shows a liquid cooled alternative for the heat sink in FIG. 1.

As still another modification, the module 10 of FIG. 1 may be changed such that—a) the integrated circuit package 11 is replaced with any heat generating unit, and/or b) the heat sink 15 is replaced with any heat receiving unit. For example, the integrated circuit package 11 can be replaced with an electrical power transformer which dissipates heat due to losses in the power transforming process. Such a transformer is shown for example, in FIG. 4 of U.S. Pat. No. 5,109,326 which is entitled "High Efficiency Power Converting Cell and Versatile System of Same". Similarly, the heat sink 15 in the module 10 of FIG. 1 can be replaced with any assembly for liquid cooling integrated circuit packages. For convenience, a portion of FIG. 2 in patent '983 is reproduced herein as FIG. 15; and it shows a liquid cooling jacket 15' which can replace the heat sink 15 in FIG. 1. One example of a liquid cooling assembly is illustrated in FIG. 2 of U.S. Pat. No. 4,791,983 which is entitled "Self-Aligning Liquid Cooling Assembly". Both of the above-cited patents are assigned to the assignee of the present invention.

As yet another modification, the seal ring 13 can be made of many different materials. These include, for example: rubber, compliant silicones, elastomers, acrylics and epoxies.

As another modification, the amount of liquid metal alloy which is squeezed out of the compliant body can vary from that which was described in conjunction with FIGS. 2A–2D and TABLE 1. Preferably, the liquid metal alloy which is squeezed from the compliant body fills a portion of the space between the compliant body and the seal ring, which is at least one-tenth as large as the compliant body. Also preferably, the liquid metal alloy which is squeezed from the compliant body fills at least 10%, but less than 100%, of the space between the compliant body and the seal ring.

Accordingly, it is to be understood that the present invention is not limited to just the illustrated preferred embodiments, but is defined by the appended claims.

What is claimed is:

1. A heat transfer module, comprising, a heat generating unit and a heat receiving unit which are separated by a gap;

a compliant body, having microscopic voids therethrough, which is in said gap;

a liquid metal alloy that is absorbed in microscopic voids in said compliant body;

a seal ring, in said gap, which surrounds compliant body and is spaced, at least in part, from said compliant body; and, a clamping means which squeezes all of the above recited components together and compresses said compliant body so much that a portion of said liquid metal alloy is squeezed from said compliant body into the space between said compliant body and said seal ring.

2. A module according to claim 1 wherein said liquid metal alloy which is squeezed from said compliant body fills a portion of said space, between said compliant body and said seal ring, which is at least one-tenth as large as said compliant body.

3. A module according to claim 1 wherein said liquid metal alloy which is squeezed from said compliant body fills at least 10%, but less than 100%, of said space between said compliant body and said seal ring.

4. A module according to claim 1 wherein said liquid metal alloy which is squeezed from said compliant body fills 100% of said space between said compliant body and said seal ring.

5. A module according to claim 1 wherein said heat generating unit is an integrated circuit package.

6. A module according to claim 1 wherein said heat generating unit is an electrical power converter.

7. A module according to claim 1 wherein said heat receiving unit is a liquid cooled unit.

8. A module according to claim 1 wherein said heat receiving unit is an air cooled unit.

9. A module according to claim 1 wherein said seal ring has projections which contact said compliant body and hold the remainder of said seal ring spaced from said compliant body.

10. A module according to claim 1 wherein said compliant body has projections which contact said seal ring and hold the remainder of said compliant body spaced from said seal ring.

11. A module according to claim 1 wherein said seal ring is spaced, in its entirety, from said compliant body.

12. A module according to claim 11 wherein said seal ring is held apart from said compliant body by a separate retaining member which bridges the space there between.

13. A module according to claim 1 wherein said seal ring contacts the entire perimeter of said compliant body and said compliant body has a central opening for receiving said liquid metal alloy which is squeezed from said compliant body.

14. A module according to claim 1 wherein said seal ring contacts the entire perimeter of said compliant body and said compliant body has several internal openings for receiving said liquid metal alloy which is squeezed from said compliant body.

\* \* \* \* \*